United States Patent [19]
Gross et al.

[11] Patent Number: 5,200,959
[45] Date of Patent: Apr. 6, 1993

[54] DEVICE AND METHOD FOR DEFECT HANDLING IN SEMI-CONDUCTOR MEMORY

[75] Inventors: Stephen Gross, Mountain View; Robert D. Norman, San Jose, both of Calif.

[73] Assignee: SunDisk Corporation, Santa Clara, Calif.

[21] Appl. No.: 422,949

[22] Filed: Oct. 17, 1989

[51] Int. Cl.$^5$ ............................................. G11C 29/00
[52] U.S. Cl. .................................... 371/21.6; 371/10.1; 371/10.2; 371/11.1; 364/245.3; 364/285.3
[58] Field of Search ............... 371/21.6, 10.1, 10.2, 371/11.1; 364/245.3, 285.3, 970.1

[56] References Cited

U.S. PATENT DOCUMENTS

| | | | |
|---|---|---|---|
| 3,633,175 | 1/1972 | Harper | 340/172.5 |
| 4,355,376 | 10/1982 | Gould | 365/200 |
| 4,453,248 | 6/1984 | Ryan | 371/11 |
| 4,479,214 | 10/1984 | Ryan | 371/11 |
| 4,498,146 | 2/1985 | Martinez | 364/900 |
| 4,527,251 | 7/1985 | Nibby, Jr. et al. | 364/900 |
| 4,924,331 | 5/1990 | Robinson et al. | 360/72.1 |
| 4,953,122 | 3/1990 | Williams | 364/900 |

FOREIGN PATENT DOCUMENTS

| | | | |
|---|---|---|---|
| 50143580 | 6/1977 | Japan | 371/21.6 |
| 8302164 | 6/1983 | World Int. Prop. O. | 371/21.6 |

Primary Examiner—Robert W. Beausoliel
Assistant Examiner—Ly V. Hua
Attorney, Agent, or Firm—Majestic, Parsons, Siebert & Hsue

[57] ABSTRACT

A solid-state memory array such as an electrically erasable programmable read only memory (EEprom) or Flash EEprom array is used to store sequential data in a prescribed order. The memory includes a first information list containing addresses and defect types of previously detected defects. The defects are listed in the same prescribed order as that of the data. Only a simple controller is required to reference the information list so that writing or reading of the data will skip over the defective locations in the memory. New defects may be detected during writing by failure in verification, and those new defects will also be skipped. The memory also includes a second information list maintained by the controller. As data is written to the memory, addresses of file-markers and defects detected by write failure are entered into the list in the same prescribed order. This second list is referenced with the first list by the controller in subsequent reading to skip over both the previously and the newly detected defects.

27 Claims, 5 Drawing Sheets

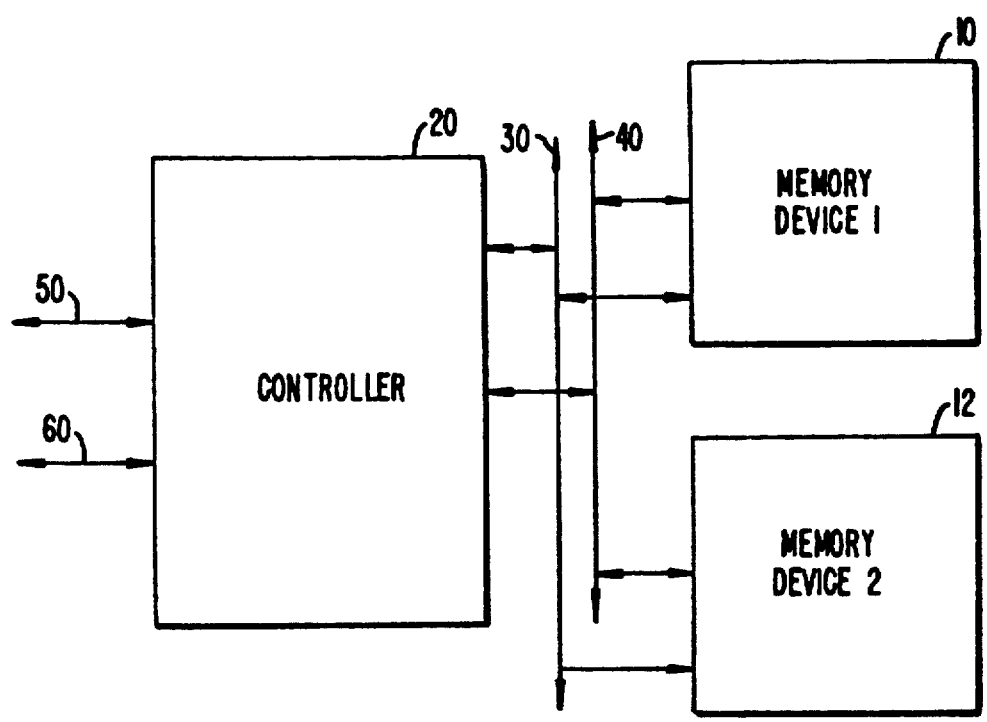
FIG._1.

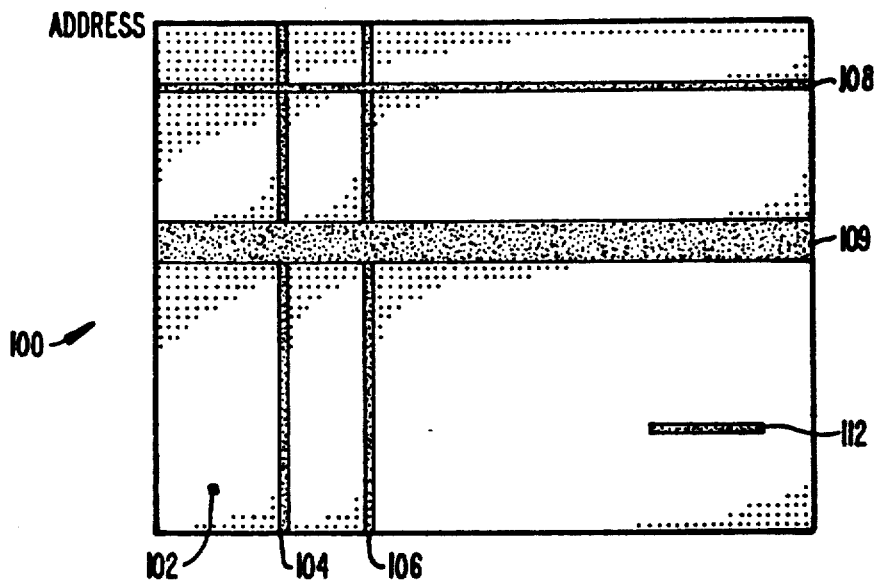
FIG._2.
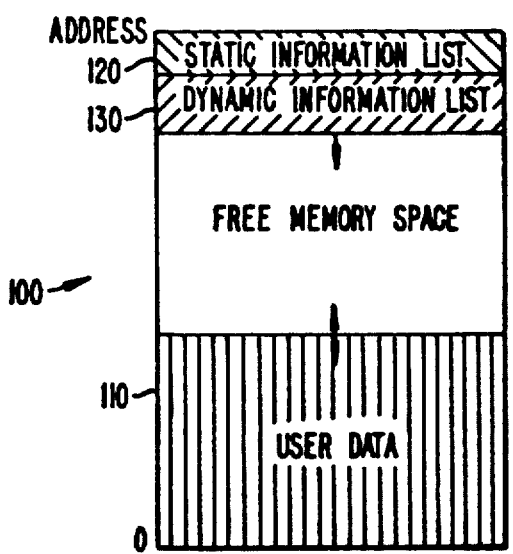
FIG._3A.
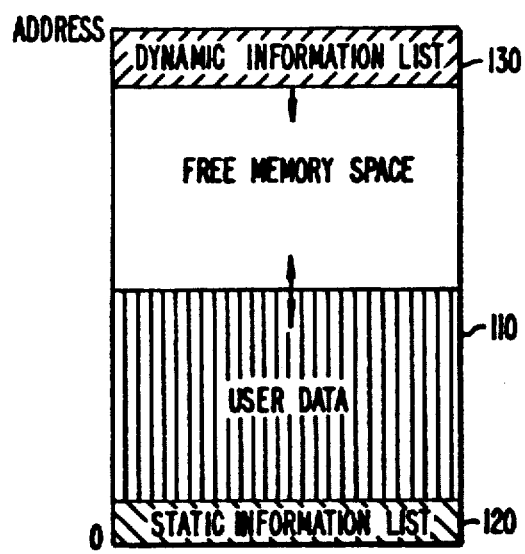
FIG._3B.

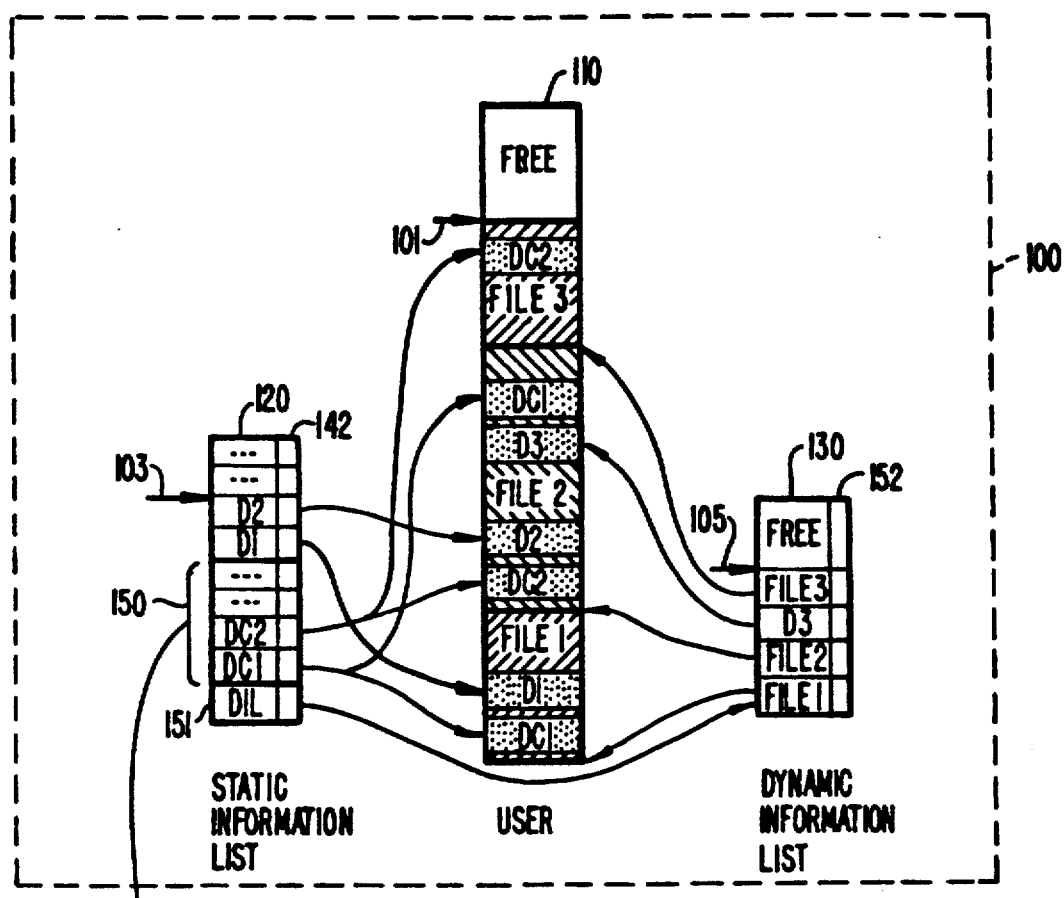
FIG._4A.
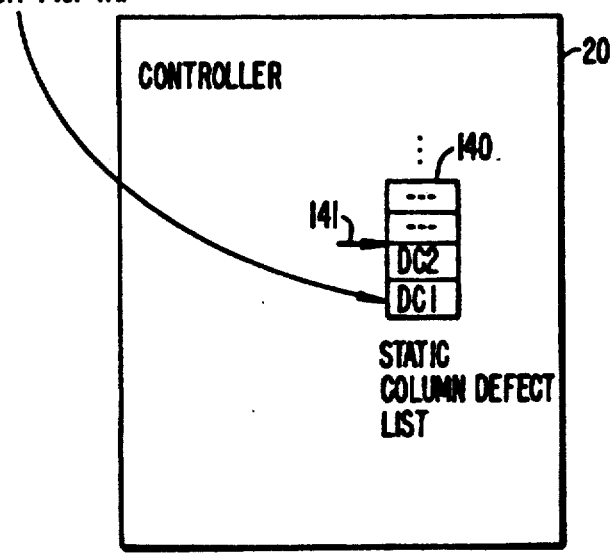
FIG._4B.

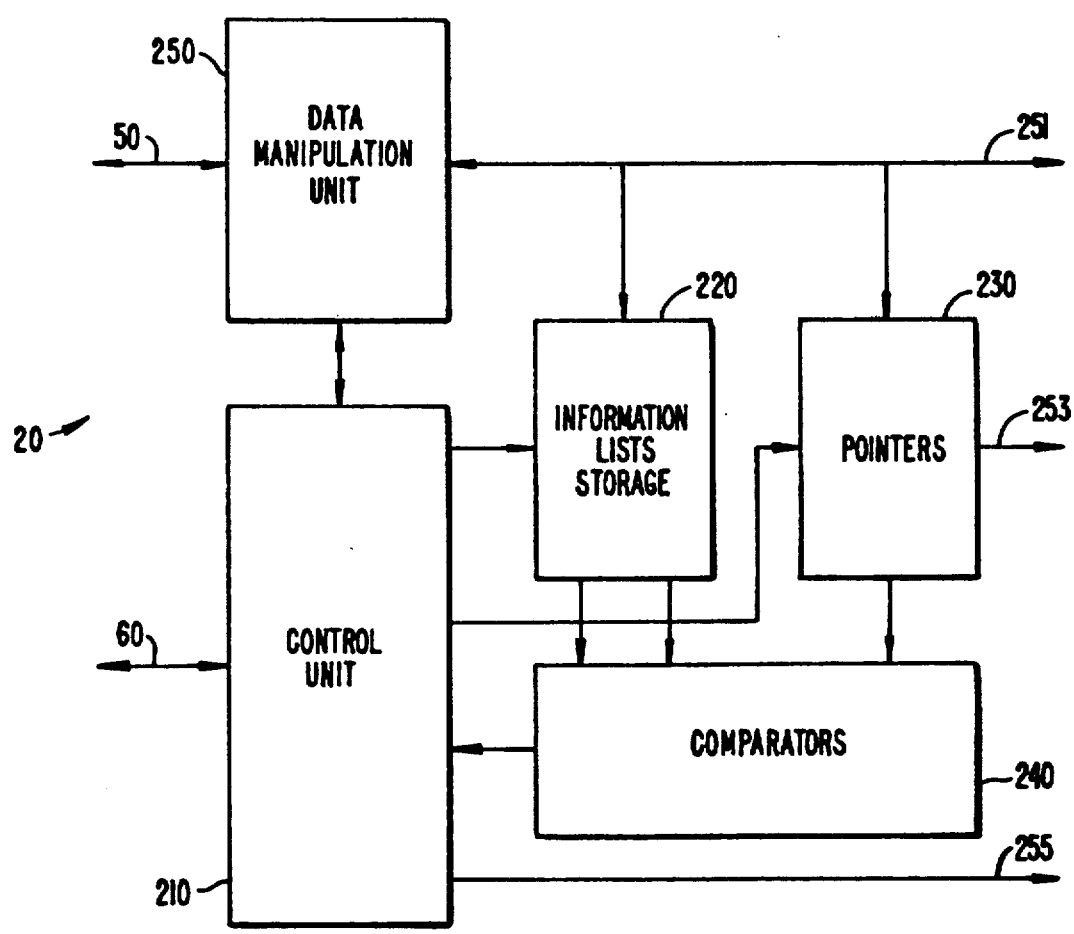
FIG._5A.

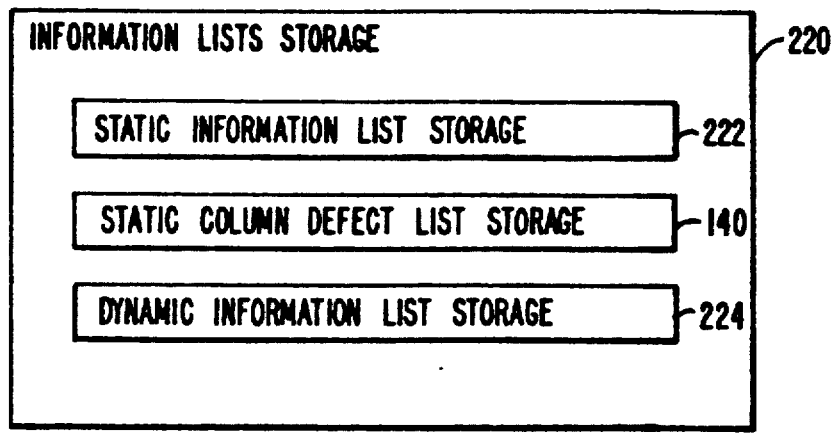
FIG._5B.
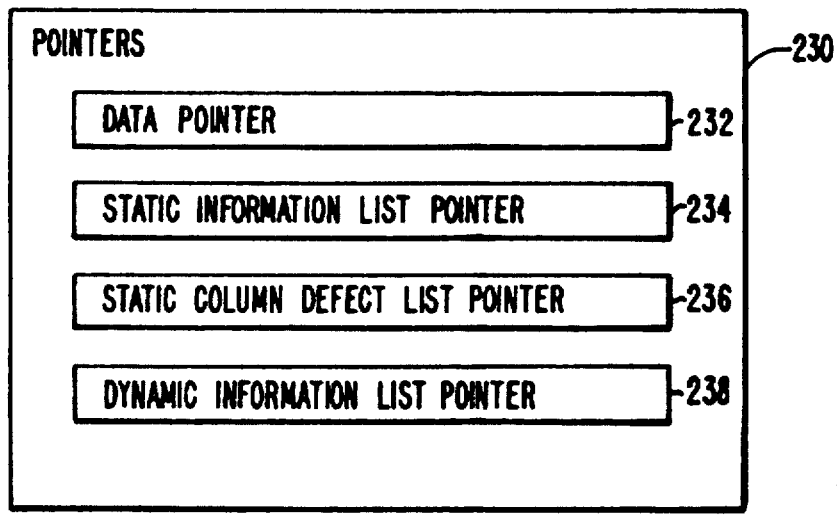
FIG._5C.
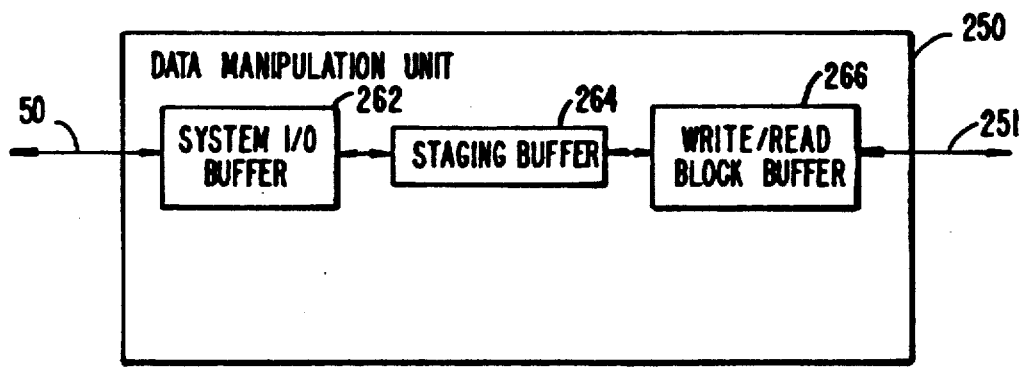
FIG._5D.

DEVICE AND METHOD FOR DEFECT HANDLING IN SEMI-CONDUCTOR MEMORY

BACKGROUND OF THE INVENTION

This invention relates generally to semi-conductor memory, and more specifically to a simplified scheme for accessing sequential data in a non-volatile memory such as an EEprom or Flash EEprom memory and handling the defects therein.

Semi-conductor memory is formed as an integrated circuit (IC) device with a two-dimensional array of memory cells arrayed in rows and columns. Each cell contains a transistor which can be put into one of its conduction states designating one of the memory states.

Computers and digital systems typically use magnetic disk drives for permanent mass storage of data. However, disk drives are disadvantageous in that they are bulky and in their requirement for high precision moving mechanical parts. Consequently, they are not rugged, and are complicated and prone to reliability problems, as well as consuming significant amounts of power.

Solid state memory devices such as Random Access Memory (RAM), Read only Memory (ROM), Programmable read-only memory (PROM), UV Erasable PROM (UVEPROM), Electrically Erasable programmable read-only memory (EEprom) and Flash EEprom do not suffer from these disadvantages. However, in the case of RAM, the memory is volatile, and requires constant power to maintain its memory. Consequently, RAMs are typically used as temporary working storage.

ROM, EEprom and Flash EEprom are all non-volatile solid state memories. They retain their memory even after power is shut down. However, ROM and PROM cannot be reprogrammed. UVPROM cannot be erased electrically. On the other hand, EEprom and Flash EEprom have the further advantage of being electrically writable (or programmable) and erasable. Nevertheless, conventional EEprom and Flash EEprom have a limited lifetime due to the endurance-related stress the device suffers each time it goes through an erase/program cycle. The endurance of a Flash EEprom device is its ability to withstand a given number of program/erase cycles. The physical phenomenon limiting the endurance of conventional EEprom and Flash EEprom devices is trapping of electrons in the active dielectric films of the device. During programming, electrons are injected from the substrate to the floating gate through a dielectric interface. Similarly, during erasing, electrons are extracted from the floating gate to the erase gate through a dielectric interface. In both cases, some of the electrons are trapped by the dielectric interface. The trapped electrons oppose the applied electric field in subsequent program/erase cycles thereby causing the programmed threshold voltage to shift to a lower value and the erased threshold voltage to shift to a higher value. This can be seen in a gradual closure in the threshold voltage "window" between the "0" and "1" states. Beyond approximately $1 \times 10^4$ program/erase cycles the window closure can become sufficiently severe to cause the reading circuitry to malfunction. If cycling is continued, the device eventually experiences catastrophic failure due to a ruptured dielectric. This typically occurs at between $1 \times 10^6$ and $1 \times 10^7$ cycles, and is known as the intrinsic breakdown of the device. Thus, with use, defects tend to build up in the memory array and typically the devices are rendered unreliable after $10^3$ to $10^4$ write/erase cycles. Traditionally, EEprom and Flash EEprom are used in applications where semi-permanent storage of data or program is required but with a limited need for reprogramming.

Physical defects in memory devices give rise to defective cells. Data becomes corrupted whenever it is stored in the defective cells. In conventional memory devices such as RAM and magnetic disks, any physical defects arising from the manufacturing process are corrected at the factory.

It is the usual practice in semi-conductor memories to have redundant memory cells built into the chip. Those defective cells discovered after fabrication are discarded and remapped to these redundant cells in the array. The remapping is usually done by hard wiring at the factory. The device is then assumed to be perfect and there is little or no provision for replacing defective cells resulting from physical defects that appear later during normal operation. Error corrections mainly rely on schemes using error correction codes (ECC) which typically correct a limited number of random errors.

Similarly for EEprom or Flash EEprom devices, defects initially detected after fabrication must be treated. Subsequently, ECC may be used to correct a limited number of random errors. However, the nature of these devices is such that they tend to have more and more cell failures with increasing write/erase cycling while cell failures are largely unaffected by read cycles. If the device is used in applications going through many write/erase cycles, the errors from the defective cells that accumulate will eventually overwhelm the ECC and render the device unreliable.

Conventional handling of defects in solid-state memories are inadequate for EEprom devices in at least two respects. First, there is no effective provision for detecting and handling defects on-the-fly. Secondly, the scheme where redundant rows and columns are used to replace defective ones is inefficient. In this scheme the whole row or column is discarded and remapped even if it contains only a single defective bit. While this is very simple defect management, the number of memory bits wasted are quite material for each defect. This scheme is less acceptable for EEprom devices with higher instances of initial defects. Moreover, if the new defects are to be detected and remapped, more rows and columns will need to be mapped out and eventually reducing the memory size substantially.

Another way of treating defects in EEprom and Flash EEprom is to use schemes similar to defect remapping in disks. In the normal disk system, the medium is divided into cylinders and sectors, the sector being the basic unit in which data is stored. A controller is used to manage the operations of the disk and handle defect remapping. Before use, the medium must be initialized (or "formatted") to remap the defects. The system is partitioned into the various sectors. The sectors containing the defects are identified and are marked as bad and not to be used by the system. This is done in several ways. A defect map table is stored on a particular portion of the disk to be used by the interfacing controller. Normally, it is located both in the drive directory and in the header field of a data sector. In addition, the bad sectors are marked as bad by special I.D. and flag markers. When the defect is at an address, the data that would normally be stored there is placed in an alternative location. The requirement for alternative sectors makes the system assigns spare sectors at some specific interval or location. This reduces the amount of memory capacity and is a performance issue in how the alternative sectors are located. Also, the alternative sector remapping is not necessarily sequential with the rest of the data. Generally a sophisticated and expensive controller with microprocessor intelligence is required to handle this type of defect management. An example of defect mapping in EEprom system is disclosed in copending U.S. patent application Ser. No. 337,566, filed Apr. 13, 1989, entitled "Flash EEprom System." The copending application is assigned to the same assignee of the present application and the disclosure of which is hereby incorporated by reference.

Accordingly it is an object of the present invention to provide a memory system without the above-mentioned disadvantages.

It is another object of the invention to provide a simple and low cost memory system for storing sequential data.

It is another object of the invention to provide an EEprom or Flash EEprom system for storing sequential data.

It is another object of the invention to provide a solid-state memory system capable of handling defects detected during use of the device.

It is another object of the invention to provide a simplified and low cost controller only for writing sequential data in an EEprom or Flash EEprom system.

It is another object of the invention to provide a simplified and low cost controller only for writing and reading sequential data in an EEprom or Flash EEprom system.

SUMMARY OF THE INVENTION

These and additional objects are accomplished by improvements in solid-state memory systems such as EEprom and Flash EEprom systems and in techniques that allow simple and effective handling of defects, so that solid-state memory, even if having defects, may be used to store sequential data reliably and cheaply.

One application of the present invention is in the storage of sequential data in a portable and detachable EEprom or Flash EEprom device. Examples would be in data logging, audio or image data applications. The device is in a detachable format functionally similar to magnetic tape cassettes or floppy disks.

The invention takes advantage of the sequential nature of the data and the limited operations required by a field recording device. Because each data file is written in integral of a whole file by a long series of sequential write and not in a random access fashion, and new files are appended after the last written one, the controller needs only support simple append operations. In another implementation it may also support sequential read operations. Other functionalities such as erase and initialization may be furnished, when required, by attaching the memory medium to other systems having controllers with such capabilities. Thus by distributing the functionalities into several specialized controllers, each controller may be simplified.

The sequential writing and reading of the data in the memory also allows a defect list of the memory device to be ordered sequentially with the data. The defect list is scanned along with data access of memory locations, so that the locations' integrity can be checked simply by sequentially inspecting the current entry in the defect list.

According to one aspect of the invention, a solid-state memory such as an EEprom or Flash EEprom memory array is partitioned into a user data portion and a first information list portion. The user data portion or user memory is used for storing user data. The first information list includes a directory of previously detected defects. The defects are ordered sequentially in the same way as data is stored in the data portion. A controller references the defects listed in the first information list while accessing the user data portion. Any locations containing a defect are skipped over. Since both the user data portion and the defect list are ordered sequentially, addressing and referencing by the controller is simplified to stepping sequentially to the next location in the user memory and after a defect is processed to the next defect on the list and comparing the next location address with the next defect address from the list.

According to another aspect of the invention, the first information list includes an ordered list of column defects and an ordered list of other defects previously detected. Both defect lists are referenced when writing to and reading from the user memory.

According to another aspect of the invention, the memory is further partitioned into a second information list. This list is maintained by the controller and provides an ordered directory of files written in the user data portion and any defects detected in the user data portion during writing. The second information list is referenced sequentially together with the first list by the controller in a read operation such that any locations containing a listed defect are skipped over.

According to another aspect of the invention, a method of handling defects in solid-state memory includes assigning an ordered addressing system to the memory, detecting defects in the memory prior to commencing writing a file to the memory, storing in the memory a first list of the defects' addresses and types, and referencing the first list for skipping over the defects while accessing the memory.

According to another aspect of the invention, the method of the present invention also includes writing data files to the memory, storing in a second ordered list in the memory file-markers of data files, verifying each write operation, skipping over defects detected in failures in write verifications, and storing the addresses and the type of the defects detected in the second ordered list.

According to yet another aspect of the invention, the method of the present invention also includes reading data files from the memory, and skipping over the defects by referencing the first and second ordered lists.

The restricted functionality and the data structure allow a simple and low cost controller without the need for microprocessor intelligence, and yet be able to handle defects endemic to EEprom or Flash EEprom and other solid-state memory devices.

Additional objects, features and advantages of the present invention will be understood from the following description of the preferred embodiments, which description should be taken in conjunction with the accompanying drawings.

BRIEF DESCRIPTION OF THE DRAWINGS

FIG. 1 illustrates a system of memory devices under the control of a controller;

FIG. 2 is a schematic illustration of the various types of defects that may exist in an EEprom memory array;

FIG. 3A illustrates the memory organization according to one embodiment of the present invention;

FIG. 3B illustrates an alternative memory organization according to another embodiment of the present invention;

FIG. 4A illustrates the linkage between the user memory, the static information list and the dynamic information list;

FIG. 4B illustrates schematically the static column defects list residing in a buffer in the controller;

FIG. 5A is a schematic circuit block diagram illustrating the functional blocks within the controller for implementing write and read operations of the memory array;

FIG. 5B illustrates the components included in the Information Lists Storage block of the controller;

FIG. 5C illustrates the components included in the Pointers block of the controller;

FIG. 5D illustrates the components included in the Data Manipulation Unit block of the controller.

DETAILED DESCRIPTION OF THE PREFERRED EMBODIMENT

FIG. 1 illustrates a system of semiconductor memory. In the preferred embodiment, it comprises one or more non-volatile, EEprom or Flash EEprom memory devices 10, 12 managed by a controller 20 via an address-/data bus 30 and a control bus 40. The control bus 40 carries various control, clock and miscellaneous handshake signals, if any. In other embodiments, some of the above buses can be combined into multiplexed buses or separated into single purpose buses. The controller 20 itself is connected to a larger system (not shown) via system address/data bus 50 and system control bus 60. The larger system may be a microprocessor based system or other digital system such as a data collecting system. As mentioned before, the system is typically used for logging sequential data, and therefore the controller 20 is only required to perform simple write operations and/or read operations on the memory devices 10, 12. The EEprom or Flash EEprom memory devices 10 or 12 may be detached from the system and be reconnected to another, full-feature system for other operations such as initialization and erase. Copending U.S. patent application Ser. No. 337,579, filed Apr. 13, 1989, entitled "Multi-state EEprom Read and Write circuits and techniques," discloses an EEprom system capable of various operations, the disclosure of which is hereby incorporated by reference.

FIG. 2 shows a two dimensional array of memory cells 100 arranged in rows and columns. The memory array 100 is the storage part of the memory device such as 10, 12. Before the memory array is used for the first time, any existing defects are treated by an initialization process, much like that of formatting in magnetic disks.

Various types of defects are possible. A bit defect occurs when a single cell such as 102 is defective. A column defect such as 104, 106 can occur when a whole column of cells is shorted. Similarly, a row defect 108 occurs when a whole row of cells are rendered inoperative. There are also types of defects which are schematic in nature. For example in one scheme a block of four rows is flash-erased at a time. If the erase block fails to erase properly or a large number of cells therein are defective, the whole erase block such as an erase block 109 is declared defective. Similarly, writing and reading are usually performed with a chunk of data at a time. One example is a 64 bit write/read block (or chunk). If any bits within a chunk fails to be written correctly, the whole chunk of cells such as a chunk 112 may be declared defective.

Even after the initially detected defects are handled, the nature of the Flash EEprom device tends to have more and more cell failures with increasing write/erase cycling. ECC is used to correct a limited number of random errors that may arise in between write and read operations. However, the errors from the defective cells that accumulate with use will eventually overwhelm the ECC and render the device unusable. One important feature of the present invention is the ability of the system also to detect and handle these defects on-the-fly. Defective cells are detected by their failure to write correctly. As soon as a defective cell is identified, the controller skips over the defect location while accessing the memory and adds the new defect to the defect list. This dynamic handling of defects, in addition to conventional error correction schemes, significantly increases the reliability and prolongs the life of the device.

The present invention is concerned with the storage of data which are sequential or quasi-sequential in their use of the storage in the memory. Managing defects in the memory array requires listing the defects found and referencing the listed defects while accessing the memory, thereby being able to avoid using locations occupied by these defects in the array.

Accordingly, the memory space is partitioned into three portions as illustrated in FIG. 3A. User data portion or user memory 110 fills up from one end (e.g. bottom) of the memory array 10. The other two portions are located at the other end (top) of the memory array 100. The first portion is where the static information list 120 resides. It has a size which is fixed at initialization of the memory device. The second portion preferably begins where the first portion ends and is where the dynamic information list 130 resides.

The user data portion 110 is for a user to store data files.

The static information list 120 contains the starting address of the dynamic information list as well as information about defects known at initialization of the memory array 100. It is written there at initialization and remains unchanged until the next initialization at which time any additional defects which have been detected are incorporated into the new list.

The dynamic information list 130 essentially logs the write history of the user data portion 110 since the last initialization. It is maintained by the controller 20 and is a directory (file markers) of data files which have been written in the user data portion 110 as well as any defects found during write verification.

The user data portion 110 and the dynamic information list may be regarded as sharing the same memory space. As the user data portion 110 fills from one end (e.g. bottom up) of the memory array 100, the dynamic information list 130 fills from the other end (e.g. top down), with free memory space in between. In this way, allowance is made to accommodate the variable size of the user data portion and the dynamic information list portion. In the event when the two portions meet, the memory capacity is completely filled and no further data may be written.

FIG. 3B shows an alternative arrangement in which the static information list 120 is written at one end (e.g. bottom) of the memory array 100 at initialization. The user data portion 110 extends upwards from where the static information list 120 ends. The dynamic information list 130 begins from the top end of the memory array 100 and extends downwards.

One important feature of the present invention is the requirement that the data being written to the memory array is sequential. This allows simplification in addressing by restricting the write operation to be an append operation. Thus new files must always be appended at the end of the last written file. This architecture allows ordered lists to be built for both the static information list 120 and the dynamic information list 130. As a result, addressing and defect tracking are greatly simplified.

The memory array 100 shown in FIGS. 3A and 3B is a two dimensional array of memory cells arranged in rows and columns. The memory array 100 is filled in a definite sequence from one end to another end. In the preferred embodiment, the memory space is filled row by row. For example referring to FIG. 3A, data will fill across the bottom row starting from the cell in the first column. When the row is filled the data will move up to the next row starting from the cell in the first column again. The contents of the static information list 120 and the dynamic information list 130 fill the memory space in similar manner except they start from the top of the memory space and fill row by row downwards.

Since the memory array 100 is two-dimensional, it will be understood that discussion of rows and columns are interchangeable. Thus it is equally applicable to fill the memory column by column. Indeed, since the two-dimensional array may be randomly accessed, it could be filled in any prescribed order. All these cases are within the scope of the present protected invention.

FIG. 4A illustrates schematically the contents of the user data portion 110, the static information list 120 and the dynamic information list 130. For clarity of illustration, the three portions of the memory array 100 are illustrated schematically as three linear memory arrays each with a starting location at the bottom and an ending location at the top. The current access positions on the user data portion 110, the static information list 120 and the dynamic information list 130 are respectively denoted by arrows 101, 103, 105.

Before the memory array is used for the first time after it is manufactured, it is tested for defects. Defects detected are treated by an initialization process, much like that of formatting in magnetic disks. The initialization may be done at the factory. Essentially, a memory tester is used to locate the various defects and their types. Any defects detected in the user data portion 110 at this stage will be recorded in the static information list 120 in the order they occur in the user data portion.

For example, if at initialization, column defects DC1, DC2 and defects of other types D1, D2 are detected at the user memory 110 designated for user data, their addresses will be recorded in the static information list 120 in the order indicated by the prescribed sequence the user memory 110 will be filled. Information about the defect type will also be recorded as a tag 142 to each listed defect address at the same time.

In one embodiment, the static column defects are treated at the same level as the other static defects. Thus, the addresses of all static defects are placed on the static information list 120 as one list and in the order they appear in the user data portion 110. The static column defects will therefore appear in the list 120 periodically. During accessing of the user data portion 110, the static information list 120 will be referenced by the controller 20 in order to skip over the defects listed in the list.

In another embodiment, the column defects are preferably isolated from the rest of the defects in the static information list 120 and placed in a separate static column defect list 150 (see FIG. 4B.) This is done at initialization. The list 150 is an ordered subdirectory of column defects and may be regarded as part of the static information list 120 which resides in the memory array 100. As described in connection with FIG. 2, column defects 104, 106 cut across the rows in the user data portion 110. If the memory is filled row by row, these column defects will be encountered at every row at the same column locations. Since these defects come up frequently and regularly, they are preferably collected in a separate static column defect list 150 instead of manifesting in multiples and periodically in the list 120. During accessing of the user data portion 110, both the static column defect list 150 and the other defects listed in the static information list 120 will be referenced by the controller 20 in order to skip over all the defects listed.

Since the static column defect list 150 is referenced during accessing of every row, it may be partially or preferably fully buffered into the controller and placed in a storage 140 for easy access prior to a write or read operation. In this way, the column defect list can be accessed quickly and efficiently in the controller 20 without having to fetch them every time from the static information list located in the memory device 10. The current position in the static column defect list 150 which also resides in the storage 140 is denoted by an arrow 141.

As the static information list 120 is being compiled and written to the memory array 100, care must be taken not to lay it on any possible defective locations therein. One way of handling defects in the portion where the static information list 120 resides is to use a highly redundant code for coding the information list as well as marking the defective locations of the information list. In this way when a code designating the present location in the information list as defective is written to that defective location, it is still recognizable as such, even though it may have been somewhat corrupted. Thus, the controller avoids laying the static information list in locations where defects are detected in the portion for the list 120 and also marks those locations as defective with a code. In this way, when the portion for the list 120 is subsequently accessed to read out the static information, the controller will then be able to detect the bad locations and skip over them. Other ways of handling defects in the information lists include the use of redundant lists and discarding any highly defective device which could not be handled by the schemes described.

After the memory device 10 is initialized, it is ready for writing. For example, referring to the FIG. 4A, the controller puts the starting address of file1 in the dynamic information list 130 and begins to write the content of file1 sequentially into user memory 110.

During write operations defects are handled in two ways depending on whether the defects are found at initialization or are found during a write-verify failure. Before each new location in the user data portion 110 is written to, the static information list 120 is examined to see if that new location coincides with a defect. If a defect such as DC1 or D1 exists, the defective location will be skipped and data is written to the next good location. Each write can be followed by a verification step. (An improved EEprom or Flash EEprom device with write-verification is also disclosed in co-pending U.S. patent application Ser. No. 337,579, and pertinent portions of which are hereby incorporated by reference.) If a write fails to be verified correctly at a location, that location is declared defective and data is written onto the next good location.

At the same time the write-verify-failure defect address is stored in the dynamic information list 130 for future reference. Again the dynamic information list 130 must not be laid on any possible defective locations in the memory array 100. The technique for avoiding possible defect locations are similar to that of the static information list 120 described earlier.

In this way the dynamic information list 130 effectively logs the write history of the user memory 110. It contains an ordered list of file markers (addresses and/or file-identifers) and addresses of embedded defects that were discovered during the course of writing the files. Since the write operation is sequential, both the file markers designating the addresses and/or file-identifers of the written files and the defect addresses will automatically be put in the order they occurred in the user data portion 110.

A tag 152 associated with each address listed in the dynamic information list identifies whether the address refers to a file marker or a defect of a certain type. Example of file markers include Start-Of-List, End-Of-List, Start-Of-File and End-Of-File and File-Identifier.

The information in the dynamic information list is used in subsequent reading and erasing operations as well as in updating the defect list in the next initialization.

FIG. 5A is a schematic circuit block diagram illustrating the functional blocks within the controller for implementing write and read operations incorporating defect handling.

The controller 20 is comprised of a control unit 210, information lists storage 220, pointers 230, comparators 240 and a data manipulation unit 250. As in FIG. 1, the controller 20 is in communication with a larger system via a system address/data bus 50 and a system control bus 60. The controller is also detachably connected with memory devices 10, 12 via an output data bus 251, and output address bus 253 and an output control bus 255.

FIG. 5B illustrates the components included in the information lists storage block 220 of the controller. One component is a static information list storage 222 which is used for storing items retrieved from the static information list 120. In particular, during defect processing, the storage 222 is used for storing the address and type of the current static defect. A second component is the static column defect list storage 140 mentioned before. It is used to store a partial, or preferably a complete, list of column defects 150 which is buffered into the controller prior to the first write or read operation. A third component is a dynamic information list storage 224 which is used for storing items retrieved from the dynamic information list 130.

FIG. 5C illustrates the components included in the pointers block 230 of the controller. It includes a data pointer 232, a static information list pointer 234, a static column defect list pointer 236 and a dynamic information list pointer 238. The pointers 232, 234, 236, 238 respectively hold the addresses for accessing the user data portion 110, the static information list 120, the static column defect list 140 and the dynamic information list 130.

FIG. 5D illustrates the components included in the data manipulation unit block 250 of the controller. The data manipulation unit 250 is under the control of the control unit 210 (see FIG. 5A.) It comprises a system I/O buffer 262, a staging buffer 264 and a write/read block buffer 266.

During write operations, data from the system address/data bus 50 is buffered by the system I/O buffer 262 before being staged at the staging buffer 264. The staging buffer 264 sets up each write block of data which is buffered by the write/read block buffer 266 for writing to user data portion 110. It inserts a zero in each place in the write block which corresponds to a defective cell in the user data portion 110. After the write block of data is properly set up, it is sent to be written to the user data portion via the data bus 251.

During read operations, a read block of data read from the user data portion 110 is sent to the write/read block buffer 266 via the data bus 251. The read block of data is then buffered into the staging buffer 264. The staging buffer 264 essentially performs the reverse of that during write operations. It packs the read block of data by ignoring each place in the read block which corresponds to a defective cell in the user data portion 110. The packed read data is then buffered by the system I/O buffer 262 before being sent out via the system address/data bus 50.

The sequencing of data and signals between the controller 20 and the memory device 10 for write and read operations are given in the following section. For convenience in description, a memory cell is designated to be in the "zero" state when it is erased, and in the "one" state when it is programmed or written. In the case of a multistate memory cell, the "one" state may designate the most programmed state.

WRITE OPERATION

Referring to FIGS. 5A-5D and FIGS. 4A and 4B, a write operation is performed in the following steps:

(1) Locate the next empty location in the user data portion 110 and prepare to write the file.

(1)(a) The control unit 210 forces the static information list pointer 222 in pointers 230 to point to the beginning of the static information list 120. The static information is then accessed sequentially to obtain two sets of information. The first set is the static column defect list 150 which is read into the buffer 140 included in the information lists storage 220 via the data bus 251. The second set of information is the starting address 151 of the dynamic information list 130 which is placed into the dynamic information list pointer 238 in pointers 230.

(1)(b) The dynamic information list pointer 238 is used to scan the list 130 sequentially until the End-Of-List mark is encountered. As each End-Of-File mark is encountered during the scan, the data pointer 232 is loaded from the address area of the file mark.

(1)(c) The data pointer 232 which is now pointing to the end of the last file in the user data portion 110, is advanced, if necessary, to the next address boundary suitable for beginning a file.

(1)(d) The End-Of-List entry previously written in the dynamic information list 130 is overwritten to force it to be ignored during subsequent operations as described in step (3)(g).

(1)(e) The dynamic information list pointer 238 is advanced to the next sequential location in the list 130. At this location a Start-Of-File mark is written to the list with the address area of the mark set equal to the contents of the data pointer 232. Then a File-Identification mark is written with an identifier for the file (for example a file number or name) using the procedure described in step (3) below. The dynamic information list pointer is then advanced in preparation for storing the first write verification defect or, if no verification errors are encountered while writing the file, for storing the End-Of-File mark.

(1)(f) The static information list pointer 234 and static column defect list pointer 236 are then advanced so that each is pointing at the current defect in its respective list (i.e., the first one with an address greater or equal to the address in the data pointer 232).

This is achieved by advancing each list pointer and reading each list item by item. The static information list 120 items are read into the static information list storage 222 via the data bus 251. The static column defect list 150 is already in the storage 140. Each item from both lists 120, 150 containing a defect address is compared with the current address in the data pointer by the comparators 240. When a defect address is encountered which is equal to or greater than the current address, the comparators 240 signal the control unit 210 which in turn stops advancing the respective pointers 234, 236 for the lists 120, 150.

(1)(g) The controller 20 is now ready to write the first block of data and proceeds to Step (2).

(2) The following procedure is followed for writing each block of data in the data file.

(2)(a) Data sufficient to fill a write block is copied from the system I/O buffer 262 to the staging buffer 264 in the data manipulation unit 250 of the controller. The write-block buffer 266 is initialized to the empty state.

(2)(b) Before writing a block of data to a location, the location's address (found in the data pointer 232) is compared with the address in the dynamic defect list pointer 238. If no match occurs, free memory space is still available and operation proceeds to step (2)(c). If a match occurs, the memory is full, the writing of user data is prematurely terminated, an End-Of-List mark is written at the current location of the dynamic defect list 130 as described in step (3) and operation terminates, returning an error status condition to the system.

(2)(c) The write-block location's address (found in the data pointer 232) is compared with the address portion of the current defect from each list which will be located in the storage area 220. If any address of the current defect from any list precedes the write-block address (in the prescribed data access sequence) then the next entry in that list is fetched and operation returns directly to step (2)(b).

(2)(d) If the address of the current defect from any list matches the write-block location's address, defect handling is initiated by proceeding to step (2)(e); otherwise, the block of data is written to the location by proceeding directly to step (2)(f).

(2)(e) A defect has been found to coincide with the write-block location. Its defect type is determined and the control unit 210 signals the data manipulation unit 250 to stage the data so that it skips over the defective area. In the preferred embodiment, the data manipulation unit 250 and in particular the staging buffer 264 inserts zeros in positions in the data string which correspond to defective cells. The portion of the data which cannot be stored in the current block is held in the controller and is inserted at the beginning of the following block. This operation is accomplished by performing one of steps (2)(e)(1) through (2)(e)(3) depending upon the type of defect encountered.

(2)(e)(1) If a row defect or an erase block defect is found to coincide with the current write-block location, the data pointer 232 is advanced to the first write block beyond the defect. The column defect pointer is reinitialized to the beginning of the column defect list and processing continues with step (2)(b).

(2)(e)(2) If the defect is a write-block defect, the defective write block will be skipped and data will not be written there. The column defect pointer is reinitialized to the beginning of the column defect list and processing continues with step (2)(b).

(2)(e)(3) If the defect is a bit defect or a column defect exists within the block, the data which will appear in the write block before the location of the defective cell is transferred from the staging buffer 264 and appended to the data in the write-block buffer 266.

A dummy bit is inserted into the write-block buffer (e.g., a zero bit) at the location corresponding to where the defect has been detected.

Processing then returns to step (2)(b) in case any additional bit or column defects affect this write block.

(2)(f) At this step there are no additional known defects in the write block which is to be written. An attempt is made to write the block of data from the write-block buffer 266 as described below.

(2)(f)(1) Data bits from the staging buffer 264 are transferred and appended to the write-block buffer 266 until the write-block buffer is full.

If the system has indicated an End-Of-File condition to the controller and therefore there are insufficient bits available in the staging buffer 264 to fill the write-block buffer, dummy bits (e.g., zero bits) are appended to the write-block buffer until it is full. The following actions are taken in this situation. An End-Of-File status is set in the controller. An End-Of-File marker indicating the bit address of the first dummy bit used to fill out the write block is stored in the dynamic information list storage 238 in the controller. If all bits in the write-block buffer are dummy bits, no block is written and operation proceeds to step (2)(g)(1).

(2)(f)(2) The data in the write-block buffer 266 is then written to memory location in the user data portion 110 indicated by the data pointer 232.

(2)(b) Thereafter the written data can be verified and appropriate steps taken depending upon the results of the verification. If no verification is performed, operations proceed as though verification had been successful.

(2)(g) Thereafter the written data can be verified and is verified successfully and therefore, the block of data has been successfully written into the location in the user data portion.

If the End-Of-File flag is set, operation proceeds to step (3)(a) to write the End-Of-File mark to the dynamic information list 130.

Otherwise, those bits in the system I/O buffer 262 in the data manipulation unit 250 which correspond to the bits which were just written to the user data portion 110 are now removed from the system I/O buffer. The replenishment of the system I/O buffer 262 by the system can be readily and conventionally implemented either synchronously or asynchronously. The data pointer 232 is advanced to point to the next available write block in the user data portion 110.

The controller is now ready to perform the next write-block operation and returns to step (2)(a).

(2)(g)(2) This step is performed if the write operation is verified unsuccessfully and therefore the block of data written to the user data portion 110 has been corrupted.

The End-Of-File status is cleared if set.

A write-block defect mark is generated by joining the address in the data pointer 232 with the write-block defect tag 152 and placing them in the dynamic information list storage 224.

The write-block defect is written to the dynamic information list 130 using the general method described in step (3). Following that, the data pointer 232 is advanced and operations continue from step (2)(a).

(3) These steps describe the addition of information to the dynamic information list 130.

These steps presume that the dynamic information list pointer is pointing to the write-block where the defect mark or file mark will be written. They further presume that the mark to be written has been assembled from a tag and an address and is in the dynamic information lists storage 224 in the controller.

The encoding of the information in each entry of all the information lists is highly redundant, so that the vast majority of codes which could be encountered upon reading the entry indicate an ignore-this-entry condition. For example, this may be accomplished by requiring that all or part of the information in the entry is encoded with each information bit coded as a pair of bits in the entry where one of the bits must be zero and the other of the bits must be one (Manchester coding). If more than a specified number of the bit pairs read back from the information list entry have identical states rather than the opposite states expected, the entry satisfies the ignore-this-entry condition.

(3)(a) The dynamic information list pointer 238 is compared with the data pointer 232. If the dynamic list pointer has passed the data pointer (i.e., a collision between the data and dynamic information list 130 has taken place), then all writing is terminated immediately and a write-failure-memory-full status is made available to the system.

(3)(b) The write-block location which is pointed to by the dynamic information list pointer 238 is read and tested for an all zero (properly erased) condition. If the location is not properly erased, operation proceeds to step (3)(g) to mark the location as an ignore-this-entry entry. Otherwise, the location is properly erased and operation continues at step (3)(c).

(3)(c) An ECC code for the mark is computed and appended to the mark.

(3)(d) The mark is encoded using a highly redundant code, for example, the Manchester encoding algorithm which ensures that each bit in the mark is represented by both a zero bit and a one bit. (The ECC portion may or may not be Manchester coded.)

(3)(e) The mark is written to the location in the dynamic information list 130 as indicated by its pointer 238.

(3)(f) The location by the indicated by the dynamic information list pointer 238 is read back into the controller and compared with the value just written. If no discrepancy is found, the dynamic information list 130 has been updated successfully, and the operation proceeds to step (3)(i). If a discrepancy is found, a defect has been encountered in the dynamic information list 130 and the operation proceeds to step (3)(g).

(3)(g) The location indicated by the dynamic information list pointer 238 is forced into an ignore-this-item condition by attempting to force both bits of each bit pair to the same state, i.e., if either bit of the pair is already programmed (ones state), then both bits of the pair are written with a one and bit pairs which already are both zero are left zero.

(3)(h) The dynamic information list pointer 238 is advanced to the next location in the dynamic information list 130 and operation returns to step (3)(a) to add the desired mark the next location in the dynamic information list 130.

(3)(i) At this point the desired entry has been successfully written to the dynamic information list 130. Now the dynamic information list pointer 238 is advanced to the next write block for the dynamic information list 130.

If an End-Of-File mark was just written, it is converted to an End-Of-List mark in the dynamic information list storage 224 in the controller and the End-Of-List mark is written out by going to step (3)(a).

If an End-Of-List mark was just written, the write operation is terminated and an Operation-Complete status is made available to the system. If an error condition caused the End-Of-List mark to be written prematurely, error status is also made available to the system.

Otherwise, the operation returns to the particular step in the group of steps headed by step (1) or step (2) from where it came.

READ OPERATION

Referring to FIGS. 5A-5D and FIGS. 4A and 4B, a read operation is performed in the following steps:

(4) Prepare to read a desired file by locating the start of the file location in the user data portion 110.

(4)(a) This step is similar to step (1) (a) of the write operation. The control unit 210 forces the static information list pointer 234 in pointers 230 to point to the beginning of the static information list. The static information is then accessed sequentially to obtain two sets of information. The first set is the static column defect list 150 which is read into the storage 140 included in the storage 220 for information lists via data bus 251. The second set of information is the starting address 151 of the dynamic information list 130 which is placed into the dynamic information list pointer 238 in pointers 230.

(4)(b) The dynamic information list pointer 238 is used to scan the list 130 sequentially until the File-Identification mark which matches the desired file is encountered. As each Start-Of-File mark is encountered during the scan, the data pointer 232 is set equal to the dynamic information list pointer 238. Therefore, the data pointer will point to the location in the dynamic information list 130 which contains the Start-Of-File mark which corresponds to the desired file.

(4)(c) The dynamic information list pointer 238 is now set equal to the data pointer, so that it now points to the Start-Of-File mark for the file.

The dynamic information list pointer 238 is now used to scan the dynamic information list 130 until an End-Of-File mark, an End-Of-List, or invalid entry is encountered.

If an End-Of-File mark is encountered, the desired file is complete in the memory. Reading of the file proceeds from step (4)(d).

If an End-Of-List or invalid entry is encountered, then the desired file is incomplete in memory. In this case, operation is terminated and error status is made available to the system.

(4)(d) The dynamic information list pointer 238 is now set equal to the data pointer, so that it now points to the Start-Of-File mark for the file.

(4)(e) The data pointer is now loaded from the address portion of the Start-Of-File mark for the file.

(4)(f) The data pointer is now pointing to the beginning of the desired file in the user data portion 110.

(4)(g) The dynamic information list 130 is now scanned until a defect-mark entry or an End-Of-File entry is encountered. The final entry encountered is left in the dynamic information list storage 224 in the controller.

This simply skips over the Start-Of-File mark, the File-Identification mark and any Ignore-Item marks to locate the first defect listed in the dynamic information list 130 for the file, or the end of the file mark for the file if no defects for the file appear in the dynamic information list 130.

(4)(h) The controller is now ready to read the first block of data and proceeds to step 5.

(5) The following procedure is followed for reading each block of data in the file.

(5)(a) The read-block is read from the user data portion 110 into the read-block buffer 266.

(5)(b) The read-block location's address (found in the data pointer 232) is compared with the address portion of the current defect from each list (the current defects will be located in the storage area 220). If any address of the current defect from any list precedes the read-block address (in the prescribed data access sequence), then the next entry in that list is fetched and operation returns directly to the beginning of this step (5)(b).

(5)(c) If the address of the current defect or the End-Of-File mark from any list matches the read-block location's address, defect handling is initiated by proceeding to step (5)(d); otherwise, the read-block buffer 266 is transferred to the staging buffer 264 by proceeding directly to step (5)(f).

(5)(d) A defect or file mark has been found to coincide with the block location. Its defect type is determined and the control unit 210 signals the data manipulation unit 250 to stage the data so that it skips over the defective area. In the preferred embodiment, the data manipulation unit 250 removes data in positions in the data string which correspond to defective cells as the data is transferred from the read-block buffer 266 to the staging buffer 264. This operation is accomplished by performing one of steps (5)(e)(1) through (5)(e)(4) depending upon the type of defect encountered. The steps are listed in the order of their priority.

(5)(e)(1) If the next "defect" is an End-Of-File mark, data in the read-block buffer 266 at and beyond the bit address indicated by the mark are not part of the current file. The data which appears in the read-block buffer before the position of the End-Of-File are transferred from the read-block buffer 266 to the staging buffer 264. If the staging buffer becomes full during this operation, its contents are emptied and appended to the system I/O buffer 262. If any data remains in the staging buffer after the preceding transfer, it is transferred from the staging buffer and appended to the system I/O buffer.

The read operation is terminated and an operation-complete status is made available to the system.

(5)(e)(2) If the next defect is a row defect or an erase-block defect which is found to coincide with the current read-block location, the data pointer 232 is advanced to the first read-block beyond the defect. The static column defect pointer 236 is reinitialized to the beginning of the static column defect list 150 and processing continues with step (5)(a).

(5)(e)(3) If the next defect is a write-block defect, the data pointer 232 is advanced to the next read-block (which will be beyond the defect). The static column defect pointer 236 is reinitialized to the beginning of the static column defect list 150 and processing continues with step (5)(a).

(5)(e)(4) If the next defect is a bit defect or a column defect, the defect exists within the block. The data which appears in the read-block buffer 266 before the position of the defective cell are transferred from the read-block buffer and appended to the data in the staging buffer 264. If the staging buffer becomes full during this operation its contents are emptied and appended to the system I/O buffer 262.

The bit at the position corresponding to where the first defect has been detected is then removed from the read-block buffer 266.

Processing then returns to step (5)(b) in case any additional bit or column defects affect this write block.

(5)(f) Read operation continues from here if there are no remaining unprocessed defects or End-Of-File marks associated with the current read-block.

Any data remaining in the read-block buffer 266 are transferred and appended to the staging buffer 264. If the staging buffer becomes full during this operation, its contents are emptied and appended to the system I/O buffer 262.

After all data has been transferred to the staging buffer, the Data pointer 232 is incremented and reading continues with the next location by proceeding to step (5)(a).

While the embodiments of the various aspects of the present invention that have been described are the preferred implementation, those skilled in the art will understand that variations thereof may also be possible. Therefore, the invention is entitled to protection within the scope of the appended claims.

What is claimed is:

1. A method for handling defects of memory cells in a solid-state memory array comprising the steps of:
   assigning an address to each memory cell according to a prescribed order;
   detecting a first set of defects of the memory array and determining the address and type of each defect in the first set, said first set being detected prior to accessing of the memory;
   storing in the memory array the first set of defects, each defect being labeled by the address and type thereof and arranged by address according to the prescribed order; and
   skipping over the defects while accessing the memory array by referencing the ordered first list such that a number of memory cells appropriate to the defect type are skipped over.

2. A method for handling defects in memory cells in a solid-state memory array as in claim 1, wherein accessing the memory array includes writing data sequentially block by block thereto, verifying data in each write block after being written and before the writing of the next block, and the step of skipping over the defects while writing to the memory array further comprises:

storing in the memory array a second ordered list of file-markers, said file-markers providing demarcation addresses and identification of files written to the memory array;

detecting any defects in each write block by failure in verifying the data therein and skipping over any failed write block;

storing the addresses of any failed write block in the second ordered list such that the file-markers and the failed write blocks are ordered according to the prescribed order.

3. A method for handling defects in memory cells in a solid-state memory array as in claim 1, wherein accessing the memory array includes reading data sequentially block by block therefrom, and the step of skipping over the defects while reading from the memory array further comprises:

skipping over the defects by referencing both the first ordered list of the previously detected defects and the second ordered list of failed write blocks such that a number of memory cells appropriate to the defect type are skipped over.

4. A solid-state memory system for storing sequential data, comprising:

a memory array formed by a plurality of memory cells;

a data portion of the memory array usable for storing data files, said data portion having memory cells that are accessible in a prescribed order;

a first information list in the memory array, said first information list including an ordered directory of previously detected defects of the data portion, each defect being a cluster of one or more defective memory cells classifiable by defect type, and said ordered directory listing each defect's location and type according to the prescribed order of the memory cells in the data portion;

a controller connected to the memory array for controlling access operations thereof, said controller accessing the memory cells in the data portion in the prescribed order while responsive sequentially to the first information list for skipping over a number of defective memory cells appropriate for its defect type at each defect's location.

5. A solid-state memory system for storing sequential data as in claim 4, wherein:

each defect type includes that of column defect, row defect, erase-block defect, write-block defect and bit defect.

6. A solid-state memory system for storing sequential data as in claim 5, said first information list further including:

an ordered subdirectory of previously detected defects of the column defect type, said ordered subdirectory listing the column defects according to the prescribed order of the data portion; wherein the controller is also responsive sequentially to the ordered subdirectory of column defects when skipping over the previously detected defects.

7. A solid-state memory system for storing sequential data as in claim 6, wherein said memory array is an Electrically Erasable Programmable Read Only Memory (EEprom) or Flash EEprom.

8. A solid-state memory system for storing sequential data as in claim 6, wherein said memory array is detachably connected to the controller.

9. A solid-state memory system for storing sequential data as in claim 5, said first information list further comprising:

an ordered subdirectory of previously detected defects of the column defect type, said ordered subdirectory listing the column defects according to the prescribed order of the data portion;

a buffer in the controller for storing one or more items of the subdirectory; and wherein the controller is responsive sequentially to the ordered subdirectory of column defects in the buffer when skipping over the previously detected defects.

10. A solid-state memory system for storing sequential data as in claim 9, wherein said memory array is an Electrically Erasable Programmable Read Only Memory (EEprom) or Flash EEprom.

11. A solid-state memory system for storing sequential data as in claim 9, wherein said memory array is detachably connected to the controller.

12. A solid-state memory system for storing sequential data as in claim 5, wherein said memory array is an Electrically Erasable Programmable Read Only Memory (EEprom) or Flash EEprom.

13. A solid-state memory system for storing sequential data as in claim 5, wherein said memory array is detachably connected to the controller.

14. A solid-state memory system for storing sequential data as in claim 4, further comprising:

a second information list in the memory array maintained by the controller, said second list including an ordered directory of files stored in the data portion and defects detected while writing the files, said ordered directory of files and defects listing the files and defects according to the prescribed order of the data portion; wherein the controller accesses the memory cells in the data portion in the prescribed order thereof while responsive sequentially to the first list for skipping over the previously detected defects as well as to the second information list for skipping over defects detected while writing the files.

15. A solid-state memory system for storing sequential data as in claim 14, wherein:

the plurality of memory cells are assigned addresses in a prescribed order with a first end and second end;

the first information list occupies the memory cells from the first end and extends therefrom;

the data portion is substantially adjacent the first information list and extendable therefrom; and the second list occupies the memory cells from the second end and is extendable therefrom.

16. A solid-state memory system for storing sequential data as in claim 15, wherein said memory array is an Electrically Erasable Programmable Read Only Memory (EEprom) or Flash EEprom.

17. A solid-state memory system for storing sequential data as in claim 15, wherein said memory array is detachably connected to the controller.

18. A solid-state memory system for storing sequential data as in claim 14, wherein:

the plurality of memory cells are assigned addresses in a prescribed order with a first end and second end;

the data portion occupies the first end and is extendable therefrom;

the first information list occupies the second end and extends therefrom; and the second information list is substantially adjacent the first information list and is extendable therefrom.

19. A solid-state system for storing sequential data as in claim 18, wherein said memory array is an Electrically Erasable Programmable Read Only Memory (EEprom) or Flash EEprom.

20. A solid-state memory system for storing sequential data as in claim 18, wherein said memory array is detachably connected to the controller.

21. A solid-state memory system for storing sequential data as in claim 14, said controller further comprising:
a control means;
pointer means controlled by the control means for indicating the current accessing positions on the data portion, the first information list, the subdirectory of column defects and the second information list;
storage means controlled by the control means for holding the addresses of the current defects in the memory array;
comparator means for determining whether the current address in the data portion coincides with any one of the current defects, said control means being responsive to the comparator means; and
data manipulation means controlled by said control means for staging data such that data accessing of the data portion skips over defects.

22. A solid-state memory system for storing sequential data as in claim 21, wherein said memory array is an Electrically Erasable Programmable Read Only Memory (EEprom) or Flash EEprom.

23. A solid-state memory system for storing sequential data as in claim 21, wherein said memory array is detachably connected to the controller.

24. A solid-state memory system for storing sequential data as in claim 14, wherein said memory array is an Electrically Erasable Programmable Read Only Memory (EEprom) or Flash EEprom.

25. A solid-state memory system for storing sequential data as in claim 14, wherein said memory array is detachably connected to the controller.

26. A solid-state memory system for storing sequential data as in claim 4, wherein said memory array is an Electrically Erasable Programmable Read Only Memory (EEprom) or Flash EEprom.

27. A solid-state memory system for storing sequential data as in claim 4, wherein said memory array is detachably connected to the controller.

* * * * *